United States Patent [19]

Sato et al.

[11] Patent Number: 5,057,390

[45] Date of Patent: Oct. 15, 1991

[54] PHOTOSENSITIVE COMPOSITION

[75] Inventors: Toshiaki Sato; Junnosuke Yamuchi, both of Kurashiki; Takuji Okaya, Nagaokakyo, all of Japan

[73] Assignee: Kurary Company, Ltd., Kurashiki, Japan

[21] Appl. No.: 932,591

[22] Filed: Nov. 20, 1986

[30] Foreign Application Priority Data

Nov. 29, 1985 [JP] Japan ................. 62-270007

[51] Int. Cl.$^5$ ................. G03C 1/73
[52] U.S. Cl. ................. 430/281; 430/909; 522/116; 522/117; 522/120; 522/121; 525/59
[58] Field of Search ................. 430/281, 909; 522/116, 522/117, 120, 121; 525/59

[56] References Cited

U.S. PATENT DOCUMENTS

| | | | |
|---|---|---|---|
| 2,332,460 | 10/1983 | Muskat et al. ................. | 525/59 |
| 3,244,653 | 4/1966 | Wright et al. ................. | 525/59 |
| 4,140,605 | 2/1979 | Sano et al. ................. | 522/116 |
| 4,221,859 | 9/1989 | Fanger et al. ................. | 522/116 |
| 4,233,391 | 11/1980 | Okai et al. ................. | 522/120 |
| 4,391,686 | 7/1983 | Miller et al. ................. | 522/120 |
| 4,585,726 | 4/1986 | Wallbiln et al. ................. | 522/116 |
| 4,621,044 | 11/1986 | Fujikawa ................. | 522/121 |
| 4,654,194 | 3/1987 | Sato et al. ................. | 430/909 |

Primary Examiner—Jack P. Brammer
Attorney, Agent, or Firm—Oblon, Spivak, McClelland, Maier & Neustadt

[57] ABSTRACT

A photosensitive composition characterized by comprising:

(a) a vinyl alcohol polymer containing the following structural unit A and having a saponification degree of a vinyl ester unit of not less than 70 mol %:

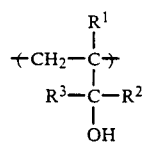

wherein $R^1$, $R^2$ and $R^3$ each represents H or a hydrocarbon group having 1 to 4 carbon atoms;

(b) a radically polymerizable ethylenic unsaturated compound; and, (c) a photopolymerization initiator, having flexiblity and impact resistance which can maintain sufficient softness but are not broken particularly even at low temperature and low humidity so that resin plates showing high printing quality can be obtained from the photosensitive composition.

7 Claims, No Drawings

PHOTOSENSITIVE COMPOSITION

BACKGROUND OF THE INVENTION

1. Field of the Invention

The present invention relates to photosensitive compositions.

Compositions comprising vinyl alcohol polymers, radically polymerizable ethylenic unsaturated compounds (hereafter referred to as polymerizable monomers) and photopolymerization initiators are termed photosensitive compositions and have been widely used as, for example, plate-making materials for letterpress plate.

2. Description of the Prior Art

The aforesaid photosensitive compositions are formed into a sheet form (termed photosensitive resin plate) on a support such as a metal plate or film plate, then exposed to light and developed to make resin plate-making materials. Photosensitive compositions using vinyl alcohol polymers have been widely used in the printing art because unhardened regions can be readily dissolved out with water after exposure to make Printing operation easy ( Published Examined Japanese Patent Application Nos. 39401/71 and 3041/75).

As described above, currently used photosensitive compositions comprising vinyl alcohol polymers are advantageous in many aspects and are used in large quantities as materials for pattern plates particularly because surface hardness of plate-making resins is high.

However, resin plates of vinyl alcohol polymer type are generally inferior in flexibility and impact resistance so that there is often caused a phenomenon that the resin plates are broken, etc. upon printing particularly in winter season where temperature and humidity are low, and such comes into a serious question. Further due to great changes in circumstances of printing technology in recent years, high quality of printed characters is required also for vinyl alcohol polymer resin plates.

SUMMARY OF THE INVENTION

An object of the present invention is to provide photosensitive compositions having flexibility and impact resistance which maintain sufficient softness but are not broken particularly even under low temperature and low humidity and can thus give resin plates having high printing quality.

DETAILED DESCRIPTION OF THE PREFERRED EMBODIMENTS

As a result of extensive investigations, the present inventors have found that the object can be achieved by the use of vinyl alcohol polymers containing the following structural unit A and having a saponification degree of a vinyl ester unit of not less than 70 mol % as vinyl alcohol polymers (vinyl alcohol polymer is hereafter referred to as PVA) and have come to accomplish the present invention:

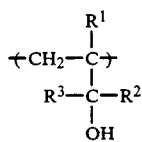

wherein $R^1$, $R^2$ and $R^3$ each represents H or a hydrocarbon group having 1 to 4 carbon atoms.

The vinyl alcohol polymer containing the following structural unit A and having a saponification degree of a vinyl ester unit of not less than 70 mol % (hereafter simply referred to as PVA polymer) of the present invention is explained below:

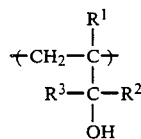

wherein $R^1$, $R^2$ and $R^3$ each represents H or a hydrocarbon group having 1 to 4 carbon atoms.

The structural unit A is more specifically shown by:

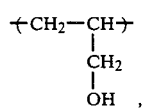

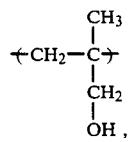

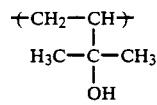

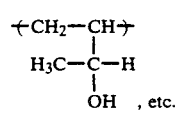

, etc.

The content is 1 to 50 mol %, preferably 2 to 30 mol %. As will be later described, the structural unit A dominates the softness of the resin plate obtained; with less than 1 mol %, the effect is extremely small and when it is introduced in amount exceeding 50 mol %, a polymerization degree is greatly reduced and therefore, the aforesaid range is preferred. Those having a polymerization degree in a range of 50 to 2000 can be used without any problem but the polymerization degree of 100 to 1000 is more preferred. Furthermore, it is preferred that the saponification degree of the vinyl ester unit be 70 mol % or more in view of dimensional stability of resin plates prior to photohardening.

The PVA polymer of the present invention can be obtained by copolymerizing vinyl esters such as vinyl acetate, etc. with monomers represented by the following general formula and by saponifying the resulting copolymer:

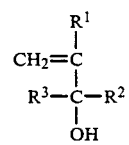

or,

-continued

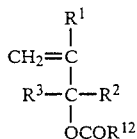

wherein $R^1$, $R^2$ and $R^3$ each represent H or a hydrocarbon group having 1 to 4 carbon atoms, and $R^{12}$ represents a $CH_3$ group or a $C_2H_5$ group. Examples of such monomers include:

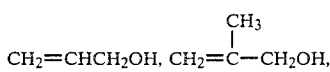

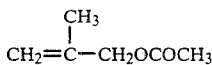

$CH_2=CHCH_2OCOCH_3$, or

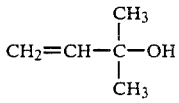

etc; of these, $CH_2=C-CH_2OCOCH_3$ and $$CH_2=CH-\underset{\underset{CH_3}{|}}{\overset{\overset{CH_3}{|}}{C}}-OH$$

are advantageously used due to their good copolymerizability with vinyl esters such as vinyl acetate, etc.

In case that the monomer represented by the general formula described above is copolymerized with vinyl esters such as vinyl acetate, etc., monomers copolymerizable therewith can also be copolymerized in a small quantity unless the object of the present invention is injured. Examples of these monomers include α-olefins such as ethylene, propylene, isobutene, etc.; acrylic acid, methacrylic acid, crotonic acid, maleic acid, itaconic acid, maleic anhydride or, salts or alkyl esters thereof; acrylonitrile, methacrylonitrile, acrylamide, methacrylamide, N,N-dimethylacrylamide, alkyl vinyl ethers, N-vinylpyrrolidone, vinyl chloride, vinylidene chloride, vinyl versatate, etc., but the monomers are not necessarily limited thereto.

As the polymerizable monomer used in the present invention, any monomer is usable as long as it is capable of radical polymerization in the presence of a photopolymerization initiator. However, those having good compatibility with the PVA polymers containing the structural unit A and showing the saponification degree of the vinyl ester unit of not less than 70 mol % and the photopolymerization initiators are preferably used. These polymerizable monomers are, for example, at least one represented by general formulae [I], [II], [III] and [IV] described below.

 [I]

wherein $R^4$ represents H or $CH_3$.

$L_1$ represents:

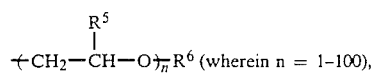

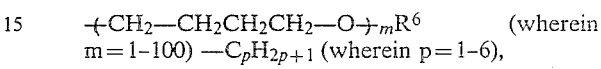 (wherein $m=1-100$) $-C_pH_{2p+1}$ (wherein $p=1-6$),

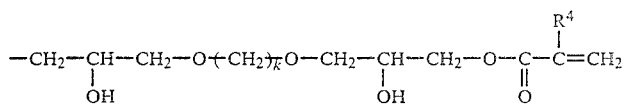

(wherein $k = 2-10$) or, 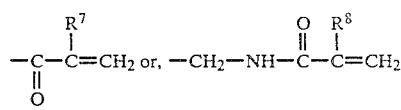

wherein $R^5$ represents H or $CH_3$, and $R^6$ represents H, $CH_3$, $C_2H_5$, $C_4H_9$,

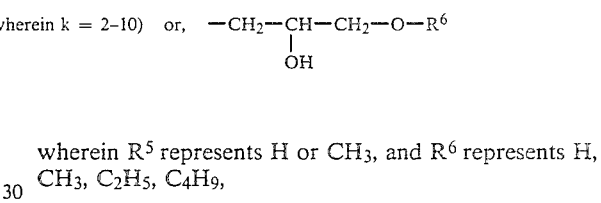

wherein $R^7$ and $R^8$ represents H or $CH_3$.

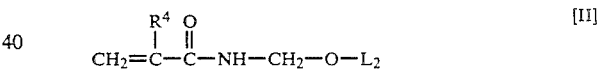 [II]

wherein $R^4$ represents H or $CH_3$, $L_2$ represents;

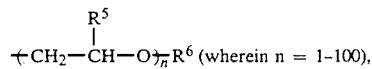

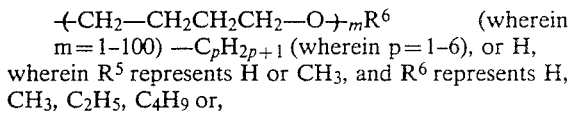 (wherein $m=1-100$) $-C_pH_{2p+1}$ (wherein $p=1-6$), or H, wherein $R^5$ represents H or $CH_3$, and $R^6$ represents H, $CH_3$, $C_2H_5$, $C_4H_9$ or,

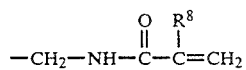

wherein $R^8$ represents H or $CH_3$.

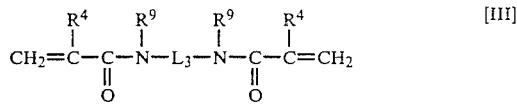 [III]

wherein $R^4$ represents H or $CH_3$,
$R^9$ represents H, $CH_3$ or $C_2H_5$,
$L_3$ represents $-(CH_2)_q$ (wherein $Q=1-6$),

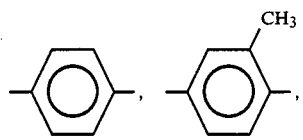

or, —(CH₂—CH₂—NH)ᵣ—CH₂CH₂— (wherein r=1-10).

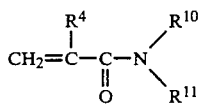

wherein R⁴ represents H or CH₃,
R¹⁰ represents H, CH₃, C₂H₅ or CH₂CH₂OH,
R¹¹ represents H, CH₃, C₂H₅ or CH₂CH₂OH.

Specific examples of compounds represented by general formula [I] described above are shown below.

| | |
|---|---|
| CH₂=CH—COOCH₂CH₂OH | (1) |
| CH₂=C(CH₃)—COOCH₂CH₂OH | (2) |
| CH₂=CH—COOCH₂CH(OH)—CH₃ | (3) |
| CH₂=C(CH₃)—COOCH₂—CH(OH)—CH₃ | (4) |
| CH₂=CH—COO—(CH₂—CH₂—O)ₙ—H (n = 1-100) | (5) |
| CH₂=C(CH₃)—COO—(CH₂—CH₂—O)ₙ—H (n = 1-100) | (6) |
| CH₂=CH—COO—(CH₂—CH₂—O)ₙ—CH₃ (n = 1-100) | (7) |
| CH₂=C(CH₃)—COO—(CH₂CH₂—O)ₙ—CH₃ (n = 1-100) | (8) |
| CH₂≡CH—COOCH₂CH₂OCH₃ | (9) |
| CH₂=CH—COOCH₂CH₂OC₂H₅ | (10) |
| CH₂=C(CH₃)—COOCH₂CH₂OCH₃ | (11) |
| CH₂=C(CH₃)—COOCH₂CH₂OC₂H₅ | (12) |
| CH₂=CH—COOCH₃ | (13) |
| CH₂=CH—COOC₂H₅ | (14) |
| CH₂=C(CH₃)—COOCH₃ | (15) |
| CH₂=CH—COOH | (16) |
| CH₂=C(CH₃)—COOH | (17) |
| CH₂=CH—COOCH₂—CH(OH)—CH₂O—(CH₂)₂—O—CH₂—CH(OH)—CH₂OOC—CH=CH₂ | (18) |
| CH₂=CH—COOCH₂—CH(OH)—CH₂—O—(CH₂)₆—O—CH₂—CH(OH)—CH₂OOC—CH=CH₂ | (19) |
| CH₂=C(CH₃)—COOCH₂—CH(OH)—CH₂O—(CH₂)₂—O—CH₂—CH(OH)—CH₂—OOC—C(CH₃)=CH₂ | (20) |

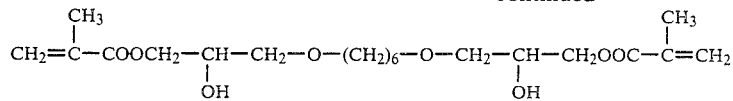 (21)

$CH_2=CH-COO-(CH_2CH_2-O)_n-COCH=CH_2$ (n = 1-100)  (22)

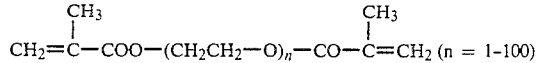 (23)

$CH_2=CH-COOCH_2-CH-CH_2-OH$
                     |
                     $OH$  (24)

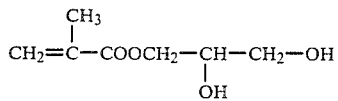 (25)

$CH_2=CH-COOCH_2-CH-CH_2-O-COCH=CH_2$
                     |
                     $OH$  (26)

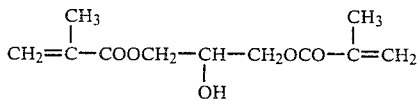 (27)

Of these, 2,4,5,6,7,8,9,10,11,12,18,20,22,23,24 and 25 are more preferred (wherein n=1-20).

Specific examples of compounds represented by general formula [II] described above are shown below.

$CH_2=CHCONHCH_2OCH_3$ (28)

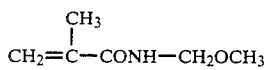 (29)

$CH_2=CH-CONHCH_2OH$ (30)

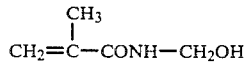 (31)

$CH_2=CH-CONHCH_2OC_2H_5$ (32)

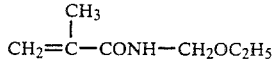 (33)

$CH_2=CHCONHCH_2OC_4H_9$ (34)

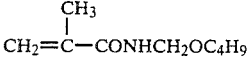 (35)

$CH_2=CHCONHCH_2O-(CH_2CH_2-O)_n-H$ (36)
(n = 1-100)

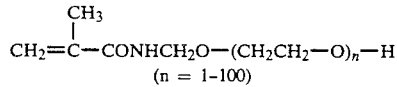 (37)
(n = 1-100)

$CH_2=CHCONHCH_2O(CH_2CH_2-O)_nCH_2NHCOCH=CH_2$ (38)
(n = 1-100)

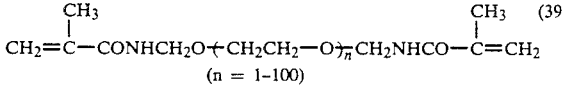 (39)
(n = 1-100)

Of these, 28,29,30,32,33,34,35,38 and 39 are more preferred (wherein n=1-20).

Specific examples of compounds represented by general formula [III] described above are shown below.

$CH_2=CHCONH-CH_2NHCOCH=CH_2$ (40)

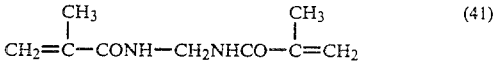 (41)

$CH_2=CHCONHCH_2CH_2NHCOCH=CH_2$ (42)

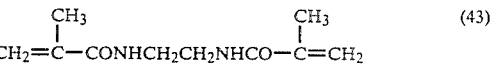 (43)

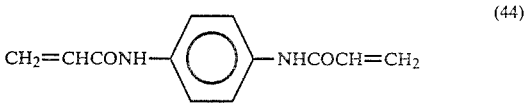 (44)

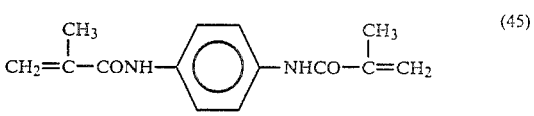 (45)

$CH_2=CHCONH-(CH_2CH_2NH)_r-CH_2CH_2NHCOCH=CH_2$ (46)
(r = 1-10)

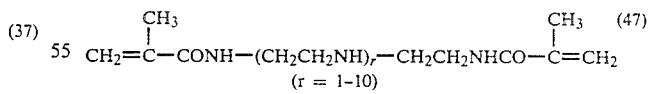 (47)
(r = 1-10)

Of these, 40,42,44 and 46 are more preferred (wherein r=1-5).

Specific examples of compounds represented by general formula [IV] described above are shown below.

$CH_2=CHCONH_2$ (48)

 (49)

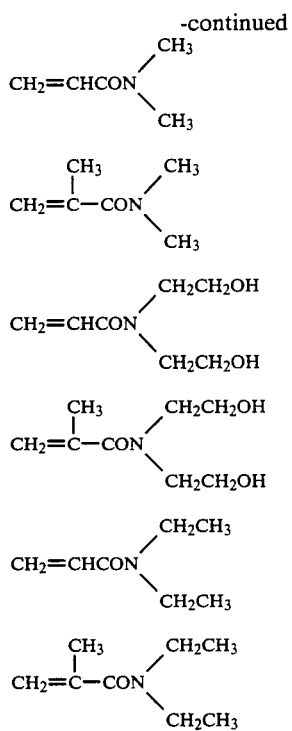

Of these, 50,51,52 and 53 are more preferred.

In addition to those represented by general formulae [I], [II], [III] and [IV] described above, monomers, particularly polyfunctional monomers such as trimethylolpropane dimethacrylate, trimethylolpropane trimethacrylate, triacryl formal, triallyl cyanulate, triallyl isocyanurate, etc. can be used as the radically polymerizable unsaturated compound, singly or in combination.

These monomers are used singly or as admixture.

Examples of the photopolymerization initiators which can be used in the present invention include benzophenone, benzoin, p,p'-dimethylbenzoin, benzoyl methyl ether, benzoin isopropyl ether, acyloin or a substituted aromatic acyloin or acyloin alkyl ethers, diacetyl, benzyl, ketoaldonyl compounds, 1,1'-azocyclohexanecarbonitrile, azonitrile, 9,10-anthraquinone, chloroanthraquinone, 1,4-naphthoquinone, 9,10-phenanthrenequinone, etc.

The photosensitive composition of the present invention comprising (a) the vinyl alcohol polymer having the structural unit A and showing the saponification degree of the vinyl ester unit of not less than 70 mol %, (b) the radically polymerizable ethylenic unsaturated compound and (c) the photopolymerization initiator are preferably used in amounts ranging from 20 to 250 parts by weight of (b) and 0.01 to 15 parts by weight of (c) based on 100 parts by weight of (a). Further components other than (a), (b) and (c), for example, unmodified vinyl alcohol polymers, polyamide polymers, etc. may also be used within such a range that does not injure the spirit of the present invention.

The photosensitive composition of the present invention may also contain known thermal polymerization inhibitors or stabilizers during storage for purposes of improving stability during storage and, if necessary and desired, may also contain other additives such as colorants, pigments, plasticizers.

The present invention is directed to the photosensitive composition having flexibility and impact resistance which can sufficiently maintain its softness but are not broken even at low temperature and low humidity and also give resin plates showing high printing quality. As has been described hereinbefore, the object can be achieved by the use of the vinyl alcohol polymer containing the aforesaid structural unit A and showing the saponification degree of the vinyl ester unit of not less than 70 mol % as a vinyl alcohol polymer. It is believed that the function and effect would be exhibited as follows.

That is, it is assumed that the introduction of the structural unit A would increase the softness of the polymer itself and in addition thereto, cause improved change in compatibility with the polymerizable monomer to impart flexibility and impact resistance to the resin plate after photohardening and thus soft one could be obtained.

Hereafter the photosensitive composition of the present invention will be described with reference to the examples but is not deemed to be limited thereto, wherein "parts" and "%" are all "parts by weight" and "% by weight", unless otherwise indicated.

Synthesis Example of Vinyl Alcohol Polymer (Polymer A in Table 1)

In a reactor were charged 354 parts of vinyl acetate (hereafter merely referred to as VAc), 46 parts of allyl acetate (hereafter merely referred to as AAc) and 500 parts of methanol. After the content was sufficiently replaced with nitrogen, the external temperature was raised to 65° C. When the inner temperature reached 60° C., 100 parts of methanol containing 8.6 parts of 2,2'-azobisisobutyronitrile were added thereto to initiate polymerization. After the polymerization was continued for 5 hours (conversion to polymer, 51.2%), the reactor was cooled and the remaining VAc was distilled out of the system together with methanol, while supplementing methanol under reduced pressure. Thus, the methanol solution of ( VAc-AAc ) copolymer was obtained. A part of the methanol solution was poured into ethyl ether to precipitate the copolymer and the resulting copolymer was purified by repeated reprecipitation with ethyl ether from an acetone solution. With respect to the resultant copolymer, a polymerization degree $(\bar{p})$ was determined by measuring $[\eta]$ in acetone at 30° C. and using the equation:

$$[\eta] = 7.94 \times 10^{-3} \times (\bar{p})^{0.62}$$

and $(\bar{p})$ showed 250.

Next, the methanol solution was added with a methanol solution of NaOH in a copolymer concentration of 50% and a molar ratio of [NaOH]/([VAc]+[AAc]) =0.007, whereby saponification was performed at 40° C. for 1 hour to give the saponification product of (VAc-AAc)copolymer (hereafter referred to as Polymer A). From $H^1$-NMR (500 MHz), it was noted that the saponification product was composed of

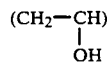

unit (simply referred to as VA),

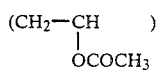

unit (simply referred to as VAc),

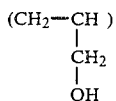

unit (simply referred to as AA) and

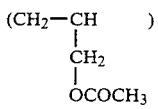

unit (simply referred to as AAc), wherein VA, VAc, AA and AAc were 72.7 mol %, 17.6 mol %, 7.6 mol % and 2.1 mol %, respectively. Therefore, the saponification degree of the vinyl ester unit was 80.5 mol %.

Polymer B through Polymer E shown in Table 1 were synthesized in a similar manner.

TABLE 1

| PVA Polymer | Structural Unit A | Saponification Degree of the Vinyl Ester Unit | Mean Polymerization Degree |
|---|---|---|---|
| Polymer A | +CH₂—CH+ \| CH₂ \| OH  7.6 mol % | 80.5 mol % | 250 |
| Polymer B | +CH₂—CH+ \| CH₂ \| OH  4.8 mol % | 76.5 mol % | 240 |
| Polymer C | +CH₂—CH+ \| H₃C—C—CH₃ \| OH  9.8 mol % | 79.2 mol % | 290 |
| Polymer D | +CH₂—CH+ \| H—C—CH₃ \| OH  5.3 mol % | 86.9 mol % | 310 |
| Polymer E | +CH₂—CH+ \| CH₂ \| OH  23.2 mol % | 90.0 mol % | 270 |

EXAMPLES 1 to 5

| | |
|---|---|
| Vinyl alcohol polymer containing the structural unit A and showing saponification degree of not less than 70 mol % (Polymer A through Polymer E shown in Table 1) | 100 parts |
| β-Oxyethyl methacrylate | 90 parts |
| Ethylene glycol dimethacrylate | 10 parts |
| Methylhydroquinone | 0.05 parts |
| Benzoin isopropyl ether | 3 parts |
| Water | 200 parts |

These components described above were homogeneously dissolved while stirring them in a flask with heating at 90° C. After defoaming, the solution was applied to an aluminum plate and a polyester film, which were dried at 80° C. for 30 minutes to give photosensitive resin plates in a thickness of 0.5 mm.

A negative was closely contacted with the resin plate obtained on the aluminum plate and irradiated with a mercury lamp of 2 KW having a wavelength of 320 to 400 mµ for 3 minutes from a distance of 75 cm. After the irradiation, the unexposed portions were washed with water at 25° C. for 5 minutes to observe dot reproducibility.

On the other hand, the resin plate obtained on the polyester film was irradiated with a mercury lamp of 2 KW having a wavelength of 320 to 400 mµ from a distance of 75 cm for 10 minutes to entirely expose to harden. Thereafter the polyester film was peeled apart. Ten sheets of the resin plate were laminated and with respect to the resulting laminate, Shore hardness (by a modification of JIS K6301-1975: [5.2] spring hardness test model A) was measured at 20° C. and 37.5% RH. The results are shown in Table 2.

Comparative Example 1

A test was performed in a similar manner to described above except that PVA-205 (polymerization degree of 550, saponification degree of 88 mol %; manufactured by KURARAY CO., LTD.) was used as a vinyl alcohol polymer. The results are shown in Table 2.

TABLE 2

| | Vinyl Alcohol Polymer and Other Polymer | Dot Reproducibility | Shore Hardness (model A) |
|---|---|---|---|
| Example 1 | Polymer A | ○ | 81 |
| Example 2 | Polymer B | ○ | 89 |
| Example 3 | Polymer C | ○ | 85 |
| Example 4 | Polymer D | ○ | 88 |
| Example 5 | Polymer E | ○ | 83 |
| Comparative Example 1 | PVA-205 | ○ | 95 |

What is claimed is:

1. A photosensitive composition consisting essentially of:
   (a) 100 parts by weight of a vinyl alcohol polymer consisting essentially of the following structural units A, vinyl alcohol units and vinyl acetate units, wherein the content of the structural unit A is 2 to 30 mol %, and wherein the molar ratio of vinyl alcohol units to the sum of vinyl alcohol units and vinyl acetate units is not less than 0.7:

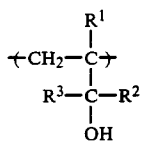 (A)

wherein $R^1$, $R^2$ and $R^3$ each represents H or a hydrocarbon group having 1 to 4 carbon atoms;
(b) 20 to 250 parts by weight of the radically polymerizable ethylenic unsaturated compound selected from the group consisting of:

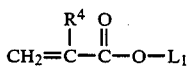 [I]

wherein $R^4$ is H or $CH_3$, and $L_1$ is:

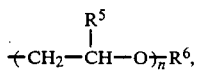

wherein n=1-100; $+CH_2-CH_2CH_2CH_2+O-_mR^6$, wherein m=1-100; $-C_pH_{2p+1}$, wherein p=1-6;

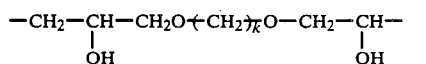

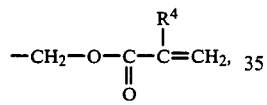

wherein k=2-10 or,

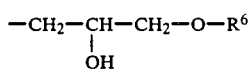

wherein $R^5$ is H or $CH_3$, and $R^6$ is hydrogen, methyl, ethyl, butyl,

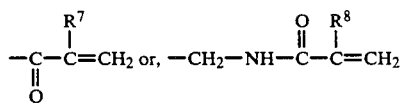

wherein $R^7$ or $R^8$ is H or $CH_3$;

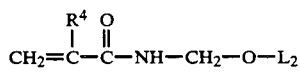 [II]

wherein $R^4$ is H or $CH_3$, and $L_2$ is

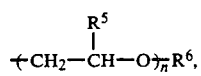

wherein N=1-100 $+CH_2-CH_2CH_2CH_2+$ $H_2-O+_mR^6$, wherein m=1-100, $-C_pH_{2p+1}$, wherein p=1-6, or hydrogen, methyl, ethyl, butyl or

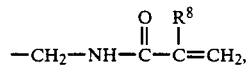

wherein $R^8$ is H or $CH_3$;

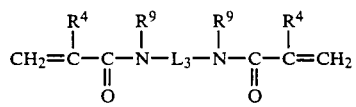 [III]

wherein
$R^4$ is H or $CH_3$,
$R^9$ is H, $CH_3$ or $C_2H_5$,
$L_3$ is $+CH_2+_q$, wherein q=1-6,

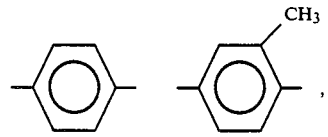

or, $+CH_2-CH_2-NH+_rCH_2-CH_2-$, wherein r=1-10;

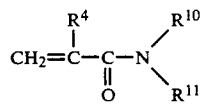 [IV]

wherein
$R^4$ is H or $CH_3$,
$R^{10}$ is H, $CH_3$, $C_2H_5$ or $CH_2CH_2OH$,
$R^{11}$ is H, $CH_3$, $C_2H_5$ or $CH_2CH_2OH$;
trimethylolpropane dimethacrylate, trimethylolpropane trimethacrylate, triacryl formal, triallyl cyanurate and triallyl isocyanurate; and,
(c) 0.01 to 15 parts by weight of a photopolymerization initiator.

2. The photosensitive composition as claimed in claim 1 wherein $R^1$, $R^2$ and $R^3$ each represent H or $CH_3$.

3. The photosensitive composition as claimed in claim 1 wherein $R^1$, $R^2$ and $R^3$ each represent H.

4. The photosensitive composition as claimed in claim 1 wherein $R^1$ represents H, and $R^2$ and $R^3$ each represent $CH_3$.

5. The photosensitive composition of claim 1, wherein said structural units of formula A are derived from reacting monomer species of the formulas:

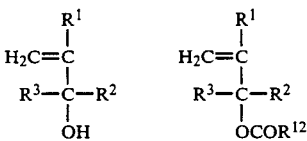

wherein, in each of the formulas above, groups $R^1$, $R^2$ and $R^3$ are as defined above, and group $R^{12}$ is methyl or ethyl.

6. The photosensitive composition of claim 5, wherein said reacting monomer giving rise to units of formula A is selected from the group consisting of allyl alcohol, β-methylallyl alcohol, α,α-dimethylallyl alcohol, α-methylallyl alcohol, allyl acetate and β-methylallyl acetate.

7. A plate-making material for letterpress plate comprising a photosensitive composition consisting essentially of:
(a) 100 parts by weight of a vinyl alcohol polymer consisting essentially of the following structural units A, vinyl alcohol units and vinyl acetate units wherein the content of the structural unit A is 2 to 30 mol %, and wherein the molar ratio of vinyl alcohol units to the sum of vinyl alcohol units and vinyl acetate units is not less than 0.7:

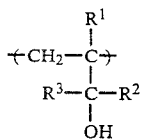
(A)

wherein $R^1$, $R^2$ and $R^3$ each represents H or a hydrocarbon group having 1 to 4 carbon atoms;
(b) 20 to 250 parts by weight of the radically polymerizable ethylenic unsaturated compound selected from the group consisting of:

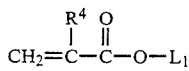
[I]

wherein $R^4$ is H or $CH_3$, and $L_1$ is:

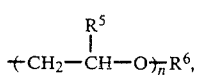

wherein n=1–100; $+CH_2-CH_2CH_2CH_2-O+_m R^6$, wherein m=1–100; $-C_pH_{2p+1}$, wherein p=1–6;

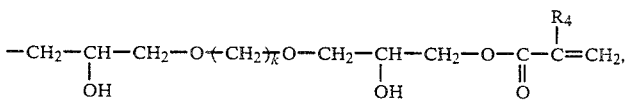

wherein k=2–10 or,

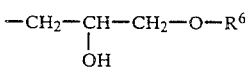

wherein $R^5$ is H or $CH_3$, and $R^6$ is hydrogen, methyl, ethyl, butyl,

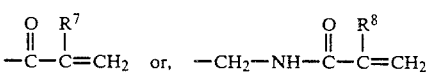

wherein $R^7$ or $R^8$ is H or $CH_3$;

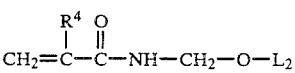
[II]

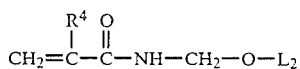
[II]

wherein $R^4$ is H or $CH_3$, and $L_2$ is

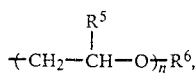

wherein n=1–100 $+CH_2-CH_2CH_2CH_2-O+_m R^6$, wherein m=1–100, $-C_pH_{2p+1}$, wherein p=1–6, or hydrogen, methyl, ethyl, butyl or

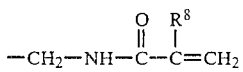

wherein $R^8$ is H or $CH_3$;

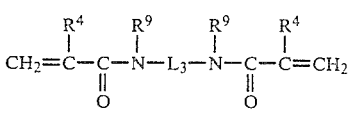
[III]

wherein
$R^4$ is H or $CH_3$,
$R^9$ is H, $CH_3$ or $C_2H_5$,
$L_3$ is $-CH_2-_q$, wherein Q=1–6,

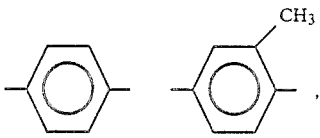

or, $-CH_2-CH_2-NH-_rCH_2-CH_2-$, wherein r=1–10;

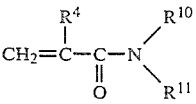
[IV]

wherein
$R^4$ is H or $CH_3$,
$R^{10}$ is H, $CH_3$, $C_2H_5$ or $CH_2CH_2OH$,
$R^{11}$ is H, $CH_3$, $C_2H_5$ or $CH_2CH_2OH$;
trimethylolpropane diacrylate, trimethylolpropane trimethacrylate, triacryl formal, triallyl cyanurate and triallyl isocyanurate; and,
(c) 0.01 to 15 parts by weight of the photopolymerization initiator.

* * * * *